US012759940B2

(12) United States Patent
Ouchi

(10) Patent No.: US 12,759,940 B2
(45) Date of Patent: Oct. 13, 2026

(54) ARTICLE INCLUDING POROUS LAYER CONTAINING INORGANIC PARTICLES, AND COATING LIQUID FOR FORMING POROUS LAYER CONTAINING INORGANIC PARTICLES

(71) Applicant: CANON KABUSHIKI KAISHA, Tokyo (JP)

(72) Inventor: Shun Ouchi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 529 days.

(21) Appl. No.: 18/301,802

(22) Filed: Apr. 17, 2023

(65) Prior Publication Data

US 2023/0339817 A1 Oct. 26, 2023

(30) Foreign Application Priority Data

Apr. 22, 2022 (JP) ................................ 2022-070826

(51) Int. Cl.

| | |
|---|---|
| ***C04B 35/14*** | (2006.01) |
| ***C03C 17/00*** | (2006.01) |
| ***C03C 17/42*** | (2006.01) |
| ***C04B 35/624*** | (2006.01) |
| ***C04B 35/626*** | (2006.01) |
| ***C04B 35/64*** | (2006.01) |
| ***C04B 38/00*** | (2006.01) |
| ***H10F 39/00*** | (2025.01) |

(52) U.S. Cl.

CPC ............ *C04B 35/14* (2013.01); *C03C 17/007* (2013.01); *C03C 17/42* (2013.01); *C04B 35/624* (2013.01); *C04B 35/6264* (2013.01); *C04B 35/64* (2013.01); *C04B 38/0045* (2013.01); *C04B 38/009* (2013.01); *H10F 39/805* (2025.01); *H10F 39/8063* (2025.01); *C03C 2217/45* (2013.01); *C03C 2217/465* (2013.01); *C03C 2217/478* (2013.01); *C03C 2217/732* (2013.01); *C03C 2218/113* (2013.01); *C03C 2218/116* (2013.01)

(58) Field of Classification Search

CPC .................................... G02B 1/18; G02B 3/00

See application file for complete search history.

(56) References Cited

U.S. PATENT DOCUMENTS

| | | | |
|---|---|---|---|
| 2006/0093786 | A1 | 5/2006 | Ohashi et al. |
| 2009/0191406 | A1 | 7/2009 | Yoneda et al. |
| 2010/0035039 | A1 | 2/2010 | Jing et al. |

(Continued)

FOREIGN PATENT DOCUMENTS

| | | | |
|---|---|---|---|
| EP | 3373048 | A1 | 9/2018 |
| JP | 2000289134 | A | 10/2000 |

(Continued)

*Primary Examiner* — William B Partridge
*Assistant Examiner* — Felix B Andrews
(74) *Attorney, Agent, or Firm* — Canon.U.S.A., Inc. IP Division

(57) ABSTRACT

An article includes a substrate and a porous layer disposed over the substrate, the porous layer containing inorganic particles bound by an inorganic binder, in which the inorganic particles contain chain-like particles and particles other than the chain-like particles, and the volume fraction of the chain-like particles is 55% or more and 95% or less based on the inorganic particles.

18 Claims, 5 Drawing Sheets

(56) References Cited

U.S. PATENT DOCUMENTS

| | | | | |
|---|---|---|---|---|
| 2011/0123708 | A1* | 5/2011 | Shibuta | C09D 1/00 427/68 |
| 2018/0215124 | A1 | 8/2018 | Hattori | |
| 2019/0295391 | A1* | 9/2019 | Watanabe | G03B 17/08 |
| 2019/0341409 | A1* | 11/2019 | Yamabi | H04N 23/55 |
| 2020/0068106 | A1* | 2/2020 | Tatsuno | C23C 18/1295 |
| 2020/0308415 | A1* | 10/2020 | Yamamoto | C09D 7/20 |
| 2022/0098093 | A1 | 3/2022 | Ouchi | |
| 2022/0111232 | A1 | 4/2022 | Yamamoto et al. | |

FOREIGN PATENT DOCUMENTS

| | | | |
|---|---|---|---|
| JP | 2005010470 | A | 1/2005 |
| JP | 2009226947 | A | 10/2009 |
| JP | 2012148950 | A | 8/2012 |
| JP | 2016089147 | A | 5/2016 |
| JP | 2017054111 | A | 3/2017 |
| JP | 2018145339 | A | 9/2018 |
| JP | 2018151614 | A | 9/2018 |
| JP | 2019195051 | A | 11/2019 |
| JP | 2022054404 | A | 4/2022 |

* cited by examiner

ARTICLE INCLUDING POROUS LAYER CONTAINING INORGANIC PARTICLES, AND COATING LIQUID FOR FORMING POROUS LAYER CONTAINING INORGANIC PARTICLES

BACKGROUND OF THE INVENTION

Field of the Invention

The present disclosure relates to an article including a porous layer containing inorganic particles, and to a coating liquid for forming the porous layer containing the inorganic particles.

Description of the Related Art

Porous films containing particles are known to have low refractive indices. The refractive index of such a film as a whole can be reduced by incorporating chain-like particles or hollow particles to form voids in the film. To form a porous film containing particles, a method is widely used in which a coating liquid containing particles is applied and then the resulting coating film is dried.

A method of forming a porous film using a coating liquid containing particles includes a step of evaporating a solvent contained in the coating liquid. In this step, stress is generated in the film. When an attempt is made to form a porous film having a film thickness of 1.0 μm or more, the stress is high, thereby cracking the porous film. In response to the above issue, Japanese Patent Laid-Open No. 2018-145339 discloses that a flexible epoxy resin is used as a binder for binding silicon oxide particles to each other to form a porous film that does not easily crack even when the porous film has a large film thickness.

However, the film disclosed in Japanese Patent Laid-Open No. 2018-145339 contains, as a binder, an epoxy resin having a higher refractive index than silicon oxide and thus has an increased refractive index as a whole, thereby deteriorating the performance as a low-refractive-index film.

SUMMARY OF THE INVENTION

The present disclosure has been made in view of the foregoing circumstances, and provides an article including a porous layer in which the occurrence of cracking is inhibited regardless of its film thickness.

One aspect of the present disclosure is directed to providing an article including a substrate and a porous layer disposed over the substrate, the porous layer containing inorganic particles bound by an inorganic binder, in which the inorganic particles include chain-like particles and particles other than the chain-like particles, and the volume fraction of the chain-like particles is 55% or more and 95% or less based on the inorganic particles.

Further features of the present disclosure will become apparent from the following description of exemplary embodiments with reference to the attached drawings.

DESCRIPTION OF THE EMBODIMENTS

An article, according to an embodiment of the present disclosure, including a porous layer will be described. A coating liquid for forming the porous layer and a method for forming the porous layer with the coating liquid will then be described.

Article Including Porous Layer

The porous layer included in the article according to an embodiment of the present disclosure has a low refractive index, excellent scratch resistance, and can have a large film thickness. For example, various articles can be produced by designing the voidage and the film thickness of the porous layer in ranges required for achieving desired antireflection properties and/or antifogging properties.

First Embodiment

Figure 1A:
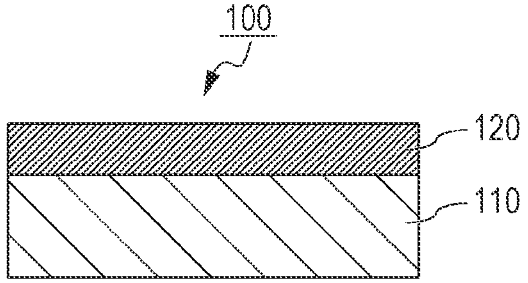
FIG. 1A is a schematic cross-sectional view illustrating a configuration example of an article according to an embodiment of the present disclosure.

FIG. 1A is a schematic view illustrating a configuration example of an article 100 according to an embodiment of the present disclosure. The article 100 illustrated in FIG. 1A includes a substrate 110 and a porous layer 120 containing inorganic particles disposed over the substrate 110. The article 100 according to the present embodiment is, for example, a lens, a mirror, a filter, or a functional film. The porous layer 120 functions as, for example, an antireflection film and/or an antifogging film in accordance with the design.

Substrate

The substrate 110 may be composed of glass, a ceramic material, a resin, a metal, a semiconductor material, or the like. The substrate 110 may have any shape, such as, but not limited to, a flat-plate shape, a curved shape having a concave or convex surface, or a film shape. For use in optical applications, a light-transmitting substrate having a transmittance of 90% or more, preferably 95% or more, in the wavelength range of 400 nm to 700 nm can be used.

The composition of the glass or the ceramic material is not limited to a particular composition. Examples thereof include zirconium oxide, titanium oxide, tantalum oxide, niobium oxide, hafnium oxide, lanthanum oxide, gadolinium oxide, silicon oxide, calcium oxide, barium oxide, sodium oxide, potassium oxide, boron oxide, and aluminum oxide. The substrate 110 can be produced by a known method, such as grinding and polishing, molding, or float process.

As the resin, a thermoplastic resin or a thermosetting resin can be used. Examples of the thermoplastic resin include poly(ethylene terephthalate) (PET), poly(ethylene naphthalate) (PEN), polypropylene (PP), poly(methyl methacrylate) (PMMA, an acrylic resin), triacetyl cellulose, polycarbonate (PC), cycloolefin polymers, and poly(vinyl alcohol). Examples of the thermosetting resin include polyimide, epoxy resins, and urethane resins.

As the metal, a metal composed of one metal element or an alloy containing two or more elements can be used.

An example of the semiconductor material is silicon.

Porous Layer

Figure 1B:
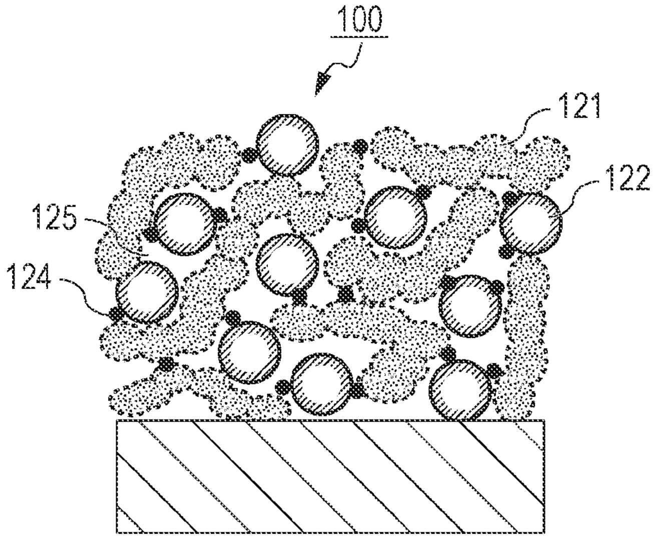
FIG. 1B is a partially enlarged view of a porous layer.

FIG. 1B is a partially enlarged view of an example of the porous layer 120. The porous layer 120 contains, as the inorganic particles, chain-like particles 121 and particles 122 other than the chain-like particles 121. The inorganic particles are bound together by an inorganic binder 124. Voids 125 are formed between the inorganic particles. The term "chain-like particles" refers to linear or bent secondary particles composed of primary solid particles bound together.

To allow the porous layer 120 to function as an antireflection film and/or an antifogging film, the refractive index can be 1.30 or less. At a refractive index of more than 1.30, the amount of voids contained in the layer is small. This leads to failure to sufficiently reduce the refractive index difference between air and the substrate 110, thus resulting in low antireflection performance and an insufficient amount of moisture absorbed to cause low antifogging performance The refractive index of the porous layer 120 cannot be reduced to 1.0, which is the refractive index of air. Thus, the porous layer 120 preferably has a refractive index of 1.15 or more and 1.30 or less, more preferably 1.18 or more and 1.25 or less, even more preferably 1.18 or more and 1.23 or less.

The refractive index of the porous layer 120 can be adjusted by the materials of the inorganic particles and the inorganic binder 124 contained in the porous layer 120 and the amount of the voids 125 (voidage). The voidage can be adjusted by the size and shape of the inorganic particles.

The film thickness of the porous layer 120 is designed based on the refractive index (voidage) of the porous layer 120 and the wavelength of light to be inhibited from being reflected or a desired antifogging performance Depending on the application of the article 100, the porous layer 120 needs to have a film thickness of 1,000 nm or more. To inhibit the formation of a crack even at a film thickness of 1,000 nm or more, the internal stress of the porous layer 120 needs to be minimized The internal stress of the porous layer 120 seems to be easily generated by an excessively high film density of the porous layer 120 or nonuniformity in the film density in the film thickness direction.

In the present disclosure, in order to form the porous layer 120 that does not easily crack even at a larger film thickness, the inorganic particles contained in the porous layer 120 include a predetermined amount of chain-like particles, and particles other than the chain-like particles, thereby inhibiting an increase in the film density of the porous layer 120. Moreover, a coating liquid for forming the porous layer is devised to reduce nonuniformity in the film density of the porous layer 120 in the film thickness direction. The coating liquid for forming the porous layer will be described below. Even when the present disclosure is used, the porous layer 120 having a film thickness of 5,000 nm tends to crack easily.

The porous layer 120 of the article according to an embodiment of the present disclosure preferably has a film thickness of 5,000 nm or less, more preferably 3,000 nm or less.

As the inorganic particles, particles of an inorganic compound having a refractive index of less than 1.5 in at least part of the visible light region are used. Specifically, particles of, for example, silicon oxide, magnesium fluoride, lithium fluoride, calcium fluoride, or barium fluoride can be used. In particular, particles of silicon oxide can be used in view of commercial availability. The composition of the inorganic particles contained in the porous layer can be identified by analyzing the cross section of the porous layer using energy-dispersive X-ray spectroscopy (EDX).

To achieve the porous layer 120 that does not crack easily even at a larger film thickness, the volume fraction of the chain-like particles 121 based on the inorganic particles in the porous layer 120 is preferably 55% or more and 95% or less, more preferably 60% or more and 95% or less. The volume fraction of the chain-like particles 121 based on the inorganic particles can be calculated by the following method. An image of a cross section of the porous layer 120 is captured with a transmission electron microscope (TEM). Then, the proportion of an area occupied by the chain-like particles 121 based on an area occupied by the inorganic particles in a predetermined area is calculated. This is performed for five or more regions. The average value thereof is defined as the volume fraction of the chain-like particles 121 based on the inorganic particles. The cross-sectional area of the porous layer observed with the transmission electron microscope can be 0.2 $\mu m^2$ or more. In this method, the average value is determined from the proportions obtained at five or more cross-sectional regions. Therefore, it is possible to obtain substantially the same value as the actual volume fraction although it is the area fraction. The inorganic particles contained in the porous layer 120 include the chain-like particles and the particles other than the chain-like particles, and the volume fraction of the chain-like particles is within the above range. In this case, the particles 122 other than the chain-like particles 121 are disposed among the chain-like particles 121 to moderately disturb the arrangement of the inorganic particles. Thus, more voids are formed among the inorganic particles than in a porous layer including particles of a single type. This can inhibit the porous layer from having an excessively high film density and can reduce the stress generated in the porous layer. The porous layer 120 containing the chain-like particles and the particles other than the chain-like particles also has the effect of achieving both of a low refractive index and good scratch resistance.

When importance is placed on the antireflection performance of the porous layer 120, voids can be formed in the layer to the extent that light scattering does not occur. The volume fraction of the chain-like particles 121 based on the inorganic particles is preferably 55% or more and 92% or less, more preferably 60% or more and 90% or less.

When importance is placed on the antifogging performance of the porous layer 120, a larger amount of voids contained in the porous layer 120 can be used because of an increase in moisture absorption. The volume fraction of the chain-like particles 121 based on the inorganic particles is preferably 65% or more and 95% or less, more preferably 70% or more and 95% or less.

The primary particles included in the chain-like particles may have a spherical shape, a cocoon shape, or a barrel shape. In particular, the cocoon shape or barrel shape can be used. Particles having a short axis with a length of 8 nm or more and 20 nm or less and a long axis with a length of 1.5 or more times and 3.0 or less times that of the short axis can be particularly used.

The thickness of the chain-like particles corresponds to the average particle diameter d of the primary particles. The average particle diameter d of the primary particles can be determined by calculating the average value of the Feret's diameters of the primary particles from an image of a cross section of the porous layer captured with a transmission electron microscope.

The primary particles can have an average particle diameter d of 8 nm or more and 20 nm or less. An average particle diameter d of less than 8 nm may result in an excessively large amount of voids formed by the particles in the porous layer to cause water and chemical substances in the ambient atmosphere to be taken in, thereby changing the optical characteristics of the porous layer. An average particle diameter d of more than 20 nm may result in unstable dispersion of the chain-like particles in the solvent of the coating liquid for forming the porous layer to deteriorate the coatability, thereby failing to form a porous layer having uniform physical properties.

The average particle diameter of the chain-like particles is preferably 3 or more times and 10 or less times, more preferably 4 or more times and 8 or less times the average particle diameter of the primary particles. When the average particle diameter of the chain-like particles is less than 3 times the average particle diameter of the primary particles, the amount of voids formed among the inorganic particles may be reduced to fail to sufficiently reduce the refractive index. When the average particle diameter of the chain-like particles is more than 10 times the average particle diameter of the primary particles, the average cavity diameter may be excessively increased to cause light to scatter, thereby deteriorating the light-transmitting properties. Moreover, the viscosity of the coating liquid is increased to deteriorate the coatability and the leveling properties. The term "average cavity diameter" used here refers to the average diameter of cavities formed by connection of the voids among the inorganic particles. The average cavity diameter can be determined by a known nitrogen gas adsorption method.

The average particle diameter of the chain-like particles corresponds to the Feret's diameter of the secondary particles. The average particle diameter of the chain-like particles can be determined by calculating the average value of the Feret's diameters of at least 50 or more chain-like particles from an image captured with a transmission electron microscope.

FIG. 1B illustrates an example of the porous layer 120 containing hollow particles serving as the particles 122 other than the chain-like particles. When the particles 122 other than the chain-like particles are hollow particles, voids can be incorporated in the porous layer 120 in addition to the voids formed among the particles, so that the refractive index can be easily reduced.

As the particles 122 other than the chain-like particles, particles having a shape other than a chain-like shape can be used. Specific examples thereof include cocoon-shaped particles, spherical particles, disk-shaped particles, rod-shaped particles, needle-shaped particles, and angular particles, in addition to hollow particles. The particles 122 other than the chain-like particles are not necessarily particles of a single type. Particles of different types can be used in combination. A larger number of types of the particles 122 other than the chain-like particles contained in the porous layer 120 can result in the increase of the voids formed among the inorganic particles to further reduce the internal stress of the porous layer 120.

The hollow particles preferably have an average particle diameter of 15 nm or more and 300 nm or less, more preferably 30 nm or more and 80 nm or less. When the average particle diameter is less than 15 nm, it is difficult to stably produce particles. When the average particle diameter is more than 300 nm, large voids are easily formed among particles and are liable to lead to scattering by the inorganic particles.

The average particle diameter of the hollow particles refers to the Feret's diameter. The Feret's diameter can be measured by performing image processing on an image, captured with a transmission electron microscope, of the hollow particles contained in the porous layer 120.

As an image processing method, a commercially available image processing program, such as ImageJ (available from National Institutes of Health), can be used.

Specifically, the average particle diameter of the hollow particles can be determined by appropriately performing contrast adjustment, as needed, in a predetermined image region, performing particle measurement to determine the Feret's diameters of the particles, and calculating the average value of the resulting diameters of the particles.

The thickness of the shell of each hollow particle is preferably 10% or more and 50% or less, more preferably 20% or more and 35% or less, of the average particle diameter. When the thickness of the shell is less than 10%, the strength of the particle itself is insufficient. When the thickness of the shell is more than 50%, the proportion of the voids based on the volume occupied by the particles is low, thus deteriorating the effect of reducing the refractive index. The thickness of the shell of each hollow particle can be measured from an image captured with a transmission electron microscope.

When the particles 122 other than the chain-like particles are solid particles, the average particle diameter is preferably 10 nm or more and 300 nm or less, more preferably 10 nm or more and 150 nm or less, even more preferably 10 nm or more and 100 nm or less. An average particle diameter of less than 10 nm results in the deterioration of the effect of relieving the internal stress of the porous layer 120. An average particle diameter of more than 300 nm results in the increase of scattering. Similarly to the hollow particles, the average particle diameter of the solid particles can also be determined by calculating the average value of the Feret's diameters of the particles.

As the inorganic binder 124 for binding the inorganic particles to each other, an inorganic material similar to the material of the inorganic particles can be used. When the inorganic material similar to the material of the inorganic particles is used, affinity between the materials is high, and a strong binding force can be obtained with a small amount. As a result, a low refractive index can be achieved, compared with the case of using a resin binder.

When the chain-like particles 121 and the particles 122 other than the chain-like particles are silicon oxide particles, the inorganic binder 124 can be a silicon oxide compound. An example of the silicon oxide compound that can be used is a cured product of a silicon oxide oligomer obtained by hydrolyzing and condensing a silicic acid ester.

The porous layer preferably has an inorganic binder 124 content of 0.2 parts or more by mass and 20 parts or less by mass, more preferably 1 part or more by mass and 10 parts or less by mass, based on the total amount of inorganic components. At an inorganic binder 124 content of less than 0.2 parts by mass based on the inorganic particles, binding between the inorganic particles is weak, thus resulting in the formation of a film having low scratch resistance. At an inorganic binder 124 content of more than 20 parts by mass, when the porous layer 120 is formed, a component serving as the inorganic binder in the coating liquid tends to disturb the arrangement of the inorganic particles to deteriorate the scattering of visible light passing through the resulting film or to increase the refractive index.

Figure 2A:
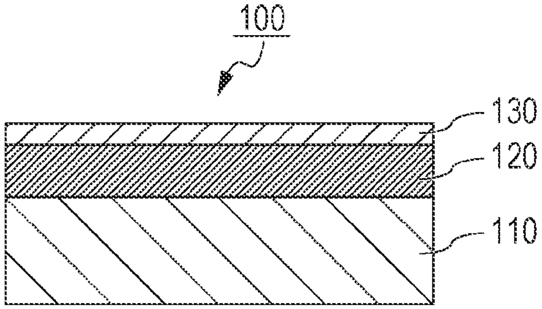
FIG. 2A is a schematic view illustrating a modified example of an article according to an embodiment of the present disclosure.
Figure 2B:
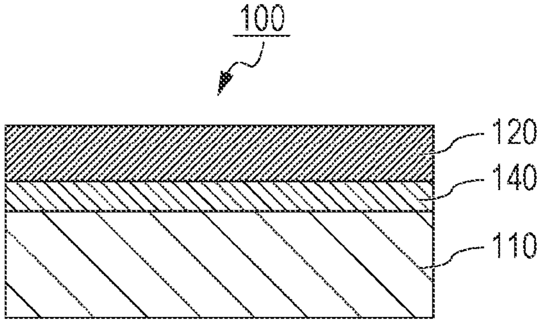
FIG. 2B is a schematic view illustrating a modified example of an article according to an embodiment of the present disclosure.
Figure 2C:
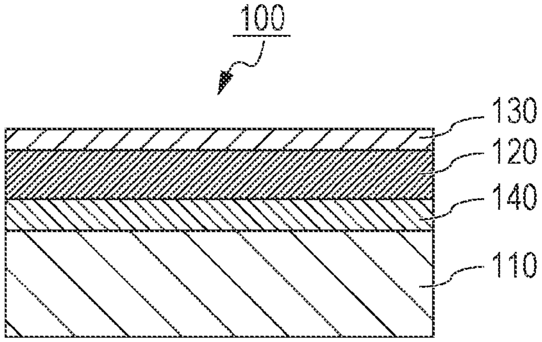
FIG. 2C is a schematic view illustrating a modified example of an article according to an embodiment of the present disclosure.

Modified examples of the article 100 illustrated in FIG. 1A are illustrated in FIGS. 2A to 2C. If necessary, as illustrated in FIG. 2A, a functional layer 130, such as a soil-resistant layer or a hydrophilic layer, may be disposed over a surface of the porous layer 120 opposite to the surface adjacent to the substrate 110. Examples of the soil-resistant layer include a layer containing a fluoropolymer, a fluorosilane monolayer, or a layer containing titanium oxide particles. As the hydrophilic layer, a hydrophilic polymer layer can be used. In particular, a layer containing a polymer having a zwitterionic hydrophilic group, such as a sulfobetaine group, a carboxybetaine group, or a phosphorylcholine group, can be used.

As illustrated in FIG. 2B, an intermediate layer 140 may be disposed between the substrate 110 and the porous layer 120 containing the particles. When the intermediate layer 140 is disposed, diffusion of impurities from the substrate 110 to the porous layer 120 can be inhibited, and the antireflection performance of the article 100 can be enhanced. The material of the intermediate layer 140 may be selected in accordance with the purpose. The intermediate layer 140 may be an inorganic compound layer composed of an inorganic compound, such as an oxide or nitride, or a polymer layer. The intermediate layer may be a single layer or a laminate in which layers of different types are stacked.

As the intermediate layer 140 for enhancing the antireflection performance of the article 100, a laminate in which a high-refractive-index layer having a relatively high refractive index and a low-refractive-index layer having a relatively low refractive index are alternately stacked can be used. The high-refractive-index layer can have a refractive index of 1.4 or more. As the high-refractive-index layer, a layer containing one member selected from the group consisting of zirconium oxide, titanium oxide, tantalum oxide, niobium oxide, and hafnium oxide can be used. The low-refractive-index layer can have a refractive index of less than 1.4. As the low-refractive-index layer, a layer containing one member selected from the group consisting of silicon oxide and magnesium fluoride can be used. The intermediate layer 140 is not limited to a flat layer, and may have protrusions and recesses. As the intermediate layer 140 having the protrusions and the recesses, a structure having a polymer layer in which columnar or conical protruding portions or recessed portions are periodically and two-dimensionally arranged can also enhance the antireflection performance.

As illustrated in FIG. 2C, the functional layer 130 and the intermediate layer 140 may be disposed in combination.

When the article 100 is used as a light-transmitting optical article, the porous layer 120 preferably has an average transmittance of 90.0% or more, more preferably 95.0% or more, even more preferably 99.0% or more, in the wavelength range of 400 nm to 700 nm.

When the porous layer has an average transmittance of less than 90.0%, the article has insufficient light transmittance and thus is not suitable for optical applications. The porous layer 120 can have a film thickness of 300 nm or more and 5,000 nm or less.

Figure 3:
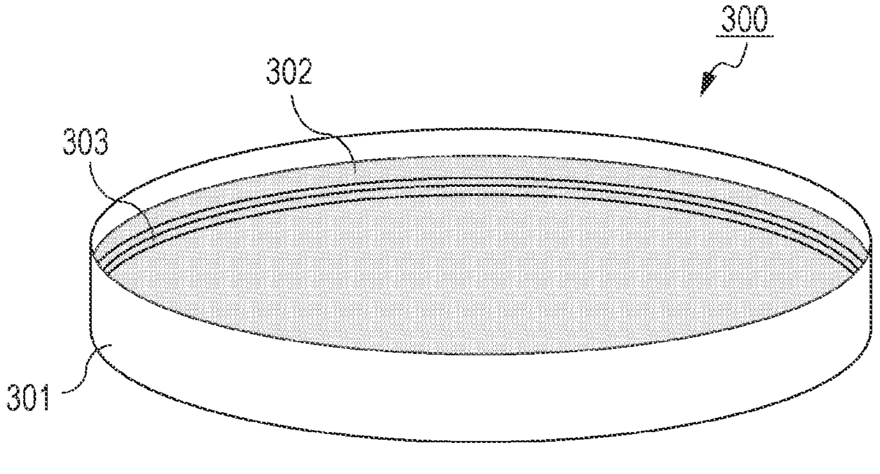
FIG. 3 is a configuration example illustrating a lens filter as an example of an article according to an embodiment of the present disclosure.

The film thickness of the porous layer 120 can be increased. Thus, a specific example of the article 100 according to an embodiment of the present disclosure is a lens filter that requires antifogging properties. In addition to the antifogging properties, the lens filter can also have the functions of protecting the lens or imparting an effect, such as softness, color tone change, polarization, or dimming, to an image to be obtained in accordance with the performance of the substrate used. FIG. 3 illustrates a configuration example of a lens filter.

A lens filter 300 has a structure in which, for example, a filter article 302 including the porous layer 120 illustrated in each of FIGS. 1A to 2C is fitted into a frame 301 having a mounting portion 303, such as a screw thread or a bayonet mount, for mounting the lens filter on a housing of an interchangeable lens. In the filter article 302, the porous layer 120 is disposed on a surface of the frame 301 adjacent to the side on which the mounting portion 303 is provided. When the lens filter 300 is attached to the housing of the interchangeable lens, the porous layer 120 is located (inside the housing) on the opposite side of the lens filter from a light incident surface. When the lens filter is exposed to a rapid temperature change, moisture in the housing is adsorbed in the voids of the porous layer 120, and fogging of the lens filter can be inhibited.

Coating Liquid

The coating liquid for forming the porous layer 120 will be described below.

The coating liquid contains inorganic particles and a component serving as an inorganic binder, which are contained in the porous layer, and an organic solvent. The inorganic particles include chain-like particles and particles other than the chain-like particles. The volume fraction of the chain-like particles based on the inorganic particles is 55% or more and 95% or less. Hereinafter, a description of the same matters as those already described may be omitted.

Inorganic Particles

The coating liquid contains the inorganic particles. The inorganic particles include the chain-like particles 121 and the particles 122 other than the chain-like particles.

The thickness of the chain-like particles 121 corresponds to the average particle diameter d of the primary particles and can be 8 nm or more and 20 nm or less. The average particle diameter d of the primary particles of the chain-like particles in the coating liquid can be calculated using the specific surface area of the chain-like particles extracted from the coating liquid. Specifically, only the chain-like particles are extracted from the coating liquid, washed, and dried. The specific surface area S of the dry particles is measured by a nitrogen adsorption method. The average particle diameter d can be calculated from the following formula (1) using the density ρ of the particles.

$$d=6/S\cdot\rho \quad (1)$$

The average particle diameter of the chain-like particles 121 corresponds to the Feret's diameter of the secondary particles. The average particle diameter of the chain-like particles can be determined by applying a dispersion of the particles to a substrate, drying the resulting coating film in a vacuum, capturing an image with a transmission electron microscope, and measuring the particle diameters on the image. As described above, the average particle diameter of the chain-like particles 121 is preferably 3 or more times and 10 or less times, more preferably 4 or more times and 8 or less times, the average particle diameter of the primary particles. When the average particle diameter of the primary particles of the chain-like particles 121 is more than 10 times, the viscosity of the coating liquid may be increased to deteriorate the coatability and the leveling properties.

The particles 122 other than the chain-like particles contained in the coating liquid are particles having a shape other than a chain-like shape. Examples thereof include hollow particles, cocoon-shaped particles, spherical particles, disk-shaped particles, rod-shaped particles, needle-shaped particles, and angular particles. When the particles other than the chain-like particles are hollow particles, the average particle diameter (Feret's diameter) of the hollow particles contained in the coating liquid can be measured by performing image processing on an image captured with a transmission electron microscope, as in the case of the hollow particles contained in the porous layer 120. The average particle diameter of the hollow particles is preferably 15 nm or more and 300 nm or less, more preferably 30 nm or more and 80 nm or less.

When the particles 122 other than the chain-like particles are solid particles, the average particle diameter (Feret's diameter) of the particles in the coating liquid can be determined by a dynamic light scattering method. The average particle diameter of the solid particles is preferably 10 nm or more and 300 nm or less, more preferably 10 nm or more and 150 nm or less, even more preferably 10 nm or more and 100 nm or less.

To form the porous layer 120 that does not crack easily even at a larger film thickness, the volume fraction of the chain-like particles 121 based on the inorganic particles contained in the coating liquid is preferably 55% or more and 95% or less, more preferably 60% or more and 95% or less. The proportion of the chain-like particles 121 based on the inorganic particles can be determined as follows: An image of the coating liquid or an image of the inorganic particles extracted and dried from the coating liquid is captured with a transmission electron microscope or scanning electron microscope. The proportion of the area occupied by the chain-like particles 121 based on the area occupied by the inorganic particles is calculated.

In the case where the chain-like particles account for the above-described proportion based on the inorganic particles contained in the coating liquid and where the inorganic particles include the particles other than the chain-like particles, the particles 122 other than the chain-like particles are disposed among the chain-like particles 121 to appropriately disturb the arrangement of the inorganic particles, thereby forming voids among the inorganic particles. This can inhibit the porous layer from having an excessively high film density and can reduce the stress generated in the porous layer.

Component Serving as Inorganic Binder

As the inorganic binder 124 for binding the inorganic particles to each other, an inorganic material similar to the material of the inorganic particles can be used. When silicon oxide particles are used as the chain-like particles 121 and the particles 122 other than chain-like particles, a silicon oxide compound can be used as a component serving as the inorganic binder. Examples of the silicon oxide compound include silicon oxide oligomers produced by hydrolysis and condensation of silicic acid esters.

The silicon oxide particles originally have silanol (Si—OH) groups on the surfaces. When the silicon oxide particles and the silicon oxide oligomer are mixed in the coating liquid, the number of silanol groups on the surfaces can be increased. This makes it possible to make the surfaces of the inorganic particles more easily bindable. In the case where the coating liquid is applied and where the resulting coating film is dried, the inorganic particles are bound to each other by the cured product of the silicon oxide oligomer, thereby forming a film having high scratch resistance.

The amount of component serving as the inorganic binder contained in the coating liquid of an embodiment of the present disclosure is preferably 0.2 parts or more by mass and 20 parts or less by mass, more preferably 1 part or more by mass and 10 parts or less by mass, based on the solute (solid component) contained in the coating liquid. When the amount of component serving as the inorganic binder is less than 0.2 parts by mass based on the inorganic particles, binding between the inorganic particles is weak, thus resulting in the formation of a film having low scratch resistance. When the amount of component serving as the inorganic binder is more than 20 parts by mass based on the inorganic particles, the inorganic binder tends to disturb the arrangement of the particles to deteriorate the scattering of visible light by the resulting film or to increase the refractive index.

Organic Solvent

When the inorganic particles, that is, the chain-like particles 121 and the particles 122 other than the chain-like particles are uniformly dispersed in the coating liquid, a coating film in which the respective particles are uniformly distributed can be formed on the substrate, and stress generated in the film after the coating film is dried can be relieved. In contrast, when the inorganic particles are present in the coating liquid in an aggregated state, the inorganic particles in the aggregated state are applied to the substrate, the arrangement property is deteriorated, and a large stress is generated in the porous layer.

The solvent that can be used in the coating liquid may be a freely-selected solvent as long as it does not cause precipitation of the inorganic particles or rapid increase in viscosity of the coating liquid. For example, the following organic solvents are exemplified: monohydric alcohols, such as methanol, ethanol, 1-propanol, 2-propanol, 1-butanol, 2-butanol, 2-methylpropanol, 1-pentanol, 2-pentanol, cyclopentanol, 2-methylbutanol, 3-methylbutanol, 1-hexanol, 2-hexanol, 3-hexanol, 4-methyl-2-pentanol, 2-methyl-1-pentanol, 2-ethylbutanol, 2,4-dimethyl-3-pentanol, 3-ethylbutanol, 1-heptanol, 2-heptanol, 1-octanol, and 2-octanol; di- or higher hydric alcohols, such as ethylene glycol and triethylene glycol; ether alcohols, such as methoxyethanol, ethoxyethanol, propoxyethanol, isopropoxyethanol, butoxyethanol, 1-methoxy-2-propanol, 1-ethoxy-2-propanol, 1-propoxy-2-propanol, and 3-methoxy-1-butanol; ethers, such as dimethoxyethane, diglyme (diethylene glycol dimethyl ether), tetrahydrofuran, dioxane, diisopropyl ether, dibutyl ether, and cyclopentyl methyl ether; esters, such as ethyl formate, ethyl acetate, n-butyl acetate, methyl lactate, ethyl lactate, ethylene glycol monomethyl ether acetate, ethylene glycol monoethyl ether acetate, ethylene glycol monobutyl ether acetate, and propylene glycol monomethyl ether acetate; various aliphatic or alicyclic hydrocarbons, such as n-hexane, n-octane, cyclohexane, cyclopentane, and cyclooctane; various aromatic hydrocarbons, such as toluene, xylene and, ethylbenzene; various ketones, such as acetone, methyl ethyl ketone, methyl isobutyl ketone, cyclopentanone, and cyclohexanone; various chlorinated hydrocarbons, such as chloroform, methylene chloride, carbon tetrachloride, and tetrachloroethane; and polar aprotic solvents, such as N-methylpyrrolidone, N,N-dimethylformamide, N,N-dimethylacetamide, and ethylene carbonate. A mixture of two or more of these solvents can also be used.

In the coating film formed by applying the coating liquid, the solvent is evaporated from a surface of the coating film opposite to the surface adjacent to the substrate, and the inorganic particles are bonded to each other and arranged on the substrate. Thus, the arrangement of the inorganic particles in the porous layer is affected by the evaporation rate of the solvent. A larger amount of coating liquid applied, i.e., an attempt to form a thicker porous layer, is likely to produce a large difference in evaporation rate between the side of the coating film adjacent to the substrate and the side of the coating film remote from the substrate, thereby resulting in a difference in film density in the film thickness direction. Specifically, the film density is high on the side of the coating film adjacent to the substrate of the porous layer 120, and low on the side of the coating film remote from the substrate. The difference in film density in the film thickness direction of the porous layer 120 generates the internal stress to cause the formation of a crack.

The difference in film density in the film thickness direction of the porous layer appears as a difference in refractive index in the film thickness direction of the porous layer. To inhibit the cracking of the porous layer disposed on the flat surface of the substrate, the difference in refractive index between a region of the porous layer 120 extending from the position of half of the film thickness of the porous layer 120 to the side of the porous layer 120 adjacent to the substrate and a region of the porous layer 120 extending from the position of half of the film thickness of the porous layer 120 to the side of the porous layer 120 remote from the substrate is preferably 0.01 or less, more preferably 0.005 or less, even more preferably 0.003 or less. The film thickness of the porous layer 120 is an average value of film thicknesses measured at 10 or more positions of the porous layer 120.

When the evaporation rate of the solvent of the coating liquid is decreased, the unbound inorganic particles can be rearranged in the coating liquid in accordance with the arrangement of the previously bound inorganic particles to reduce the nonuniformity of the arrangement of the inorganic particles in the film thickness direction. To produce a crack-free porous layer having a large film thickness, the coating liquid containing the chain-like particles 121 and the particles 122 other than the chain-like particles can be used. In the drying process after the coating, the evaporation rate can be minimized, thereby uniformly arranging these inorganic particles.

From the viewpoints of reducing the evaporation rate and achieving both good dispersibility of the inorganic particles and good coatability of the coating liquid, the coating liquid according to an embodiment of the present disclosure contains a water-soluble hydroxy group-containing solvent having 4 to 6 carbon atoms in an amount of preferably 30% or more by mass and 80% or less by mass, more preferably 30% or more by mass and 70% or less by mass, even more preferably 30% or more by mass and 60% or less by mass. The water-soluble hydroxy group-containing solvent having 4 to 6 carbon atoms has a high boiling point among the organic solvents and thus can decrease the evaporation rate of the solvent of the coating liquid to provide the time required to uniformly arrange the inorganic particles in the coating liquid. When the water-soluble hydroxy group-containing solvent having 4 to 6 carbon atoms accounts for less than 30% by weight of the coating liquid, a difficulty lies in achieving a refractive index difference of 0.01 or less between the region of the porous layer 120 adjacent to the substrate and the region of the porous layer 120 remote from the substrate in the case of the porous layer 120 having a thickness of 1,000 nm or more. When the water-soluble hydroxy group-containing solvent having 4 to 6 carbon atoms accounts for more than 80% by mass of the solvent, the arrangement of the inorganic particles may be excessively dense, thus resulting in a refractive index of more than 1.3.

The water-soluble hydroxy group-containing solvent having 4 to 6 carbon atoms can contain at least one solvent selected from the group consisting of ethoxyethanol, propoxyethanol, isopropoxyethanol, butoxyethanol, 1-ethoxy-2-propanol, ethyl lactate, and 3-methoxy-1-butanol.

Method for Producing Article Including Porous Layer

A method for producing an article including a porous layer according to an embodiment of the present disclosure includes the steps of applying the above-described coating liquid to a substrate, and drying and/or baking the substrate to which the coating liquid has been applied.

Examples of a method for applying the coating liquid to the substrate include a spin coating method, a blade coating method, a roll coating method, a slit coating method, a printing method, a gravure coating method, and a dip coating method. In the case of producing an article having a three-dimensionally complex shape, such as a concave surface, the spin coating method can be used because it is easy to apply the coating liquid in a uniform thickness.

The drying and/or baking step is a step of forming a porous layer by removing the organic solvent and binding the inorganic particles to each other without disturbing the arrangement of the inorganic particles. The drying and/or baking step can be performed at 20° C. or higher and 200° C. or lower in accordance with the heat-resistant temperature of the substrate. The time of the drying and/or baking step may be a time at which the substrate is not affected and the organic solvent in the layer can be removed. The time is preferably 5 minutes or more and 200 hours or less, more preferably 30 minutes or more and 24 hours or less. Examples of a technique for drying and/or baking include a technique with an oven or a hot plate.

Second Embodiment

Figure 4A:
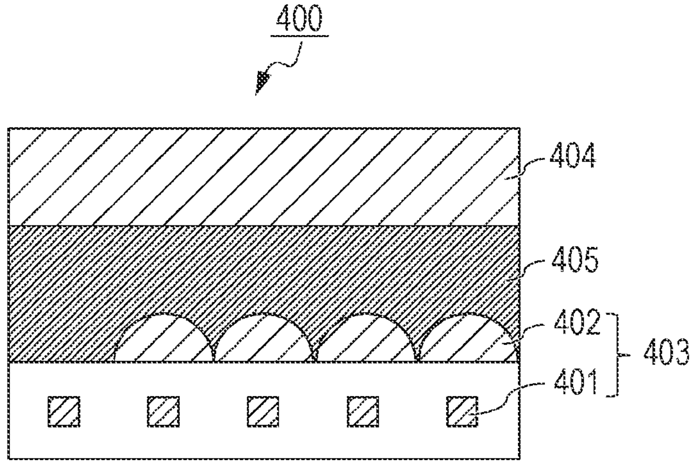
FIG. 4A illustrates a configuration example of a photoelectric conversion device as an example of an article according to an embodiment of the present disclosure.

FIG. 4A is a cross-sectional view of a photoelectric conversion device 400 as another example of the article according to an embodiment of the present disclosure.

The photoelectric conversion device 400 includes a photoelectric conversion substrate 403 including a photoelectric converter 401 and a microlens array 402, a light-transmitting plate 404, and a porous layer 405. This photoelectric conversion device includes a solid (porous layer 405) having a relatively lower refractive index than the microlens array between the microlens array 402 and the light-transmitting plate 404, and has a cavity-less structure.

The porous layer 405 is disposed between the microlens array 402 and the light-transmitting plate 404 and has a surface along protrusions and recesses of the microlens array 402 and a surface along the light-transmitting plate 404. In the microlens array 402, multiple microlenses are two-dimensionally arranged. Each microlens has a width of, for example, 0.5 μm or more and 10 μm or less and a height of, for example, 0.3 μm or more and 3 μm or less. Thus, the height difference between the protrusions and the recesses of the microlens array 402 is, for example, 0.3 μm or more and 3 μm or less.

The photoelectric conversion device 400 has a cavity-less structure and thus is superior in mechanical strength to a cavity structure in which a space is provided between the photoelectric conversion substrate 403 and the light-transmitting plate 404.

In the photoelectric conversion device 400, light incident from the outside passes through the light-transmitting plate 404 and the porous layer 405, is condensed by the microlenses, is incident on the photoelectric converter 401, and is converted into an electric signal.

To refract light incident from the outside at the interface between the porous layer 405 and the microlens array 402 and allow the light to be incident on the photoelectric converter 401, the refractive index of the porous layer 405 needs to be lower than the refractive index of the microlenses constituting the microlens array 402.

The microlens array 402 is composed of an inorganic material, such as silicon oxide, titanium oxide, niobium oxide, zirconium oxide, tantalum oxide, silicon nitride, or silicon oxynitride, or a resin material, such as an acrylic resin, an epoxy resin, a polyimide resin, or a styrene resin. The refractive index of a typical microlens is 1.40 or more and 2.10 or less. Accordingly, the refractive index of the porous layer 405 is adjusted to be smaller than 1.40.

To improve the light-condensing properties of the microlenses, the difference in refractive index between the porous layer 405 and the microlenses can be increased. The refractive index of the porous layer 405 is preferably 1.15 or more and 1.30 or less, more preferably 1.18 or more and 1.25 or less, even more preferably 1.18 or more and 1.23 or less. When the refractive index of the porous layer 405 is more than 1.30, for example, the use of a microlens composed of a resin with a refractive index of 1.50 to 1.60 deteriorates the light-condensing properties of the microlens because of a small difference in refractive index between the porous layer 405 and the microlens.

From the viewpoint of light transmission through the porous layer 405, the porous layer 405 can be referred to as a "light-transmitting film" as long as it has an average light transmittance (hereinafter, also referred to as "transmittance") of 90.0% or more in the wavelength range of 400 nm to 700 nm. The performance of the photoelectric conversion device 400 can be improved as long as the average light transmittance of the porous layer 405 suitable as a light-transmitting film is 98.5% or more in the wavelength range of 400 nm to 700 nm. The transmittance of the porous layer 405 is preferably 99.0% or more, more preferably 99.2% or more, even more preferably 99.4% or more. The transmittance of the porous layer 405 is preferably 100% or less, more preferably 99.9% or less.

Any combination of the above numerical ranges can be used.

Unless otherwise specified, the transmittance refers to the transmittance of parallel transmitted light and does not include the transmittance of diffuse transmitted light.

The film thickness of the porous layer 405 is 300 nm or more and 5,000 nm or less.

The film thickness of the porous layer 405 is preferably 800 nm or more and 5,000 nm or less, more preferably 1,000 nm or more and 5,000 nm or less, even more preferably 1,200 nm or more and 5,000 nm or less, particularly preferably 1,500 nm or more and 5,000 nm or less. The film thickness of the porous layer 405 may be 2,000 nm or less. The film thickness of the porous layer 405 may be, for example, 500 nm or more and 2,000 nm or less, 800 nm or more and 2,000 nm or less, 1,000 nm or more and 2,000 nm or less, 1,200 nm or more and 2,000 nm or less, or 1,500 nm and 2,000 nm or less.

The porous layer 405 is disposed so as to completely cover the microlens array 402. When the film thickness of the porous layer 405 is less than 300 nm, it is difficult to completely cover the microlenses, and the vertices of the microlenses may be exposed from the porous layer 405. When the film thickness of the porous layer 405 is more than 5,000 nm, the porous layer 405 cracks easily, and the transmittance may be decreased.

Here, the film thickness of porous layer 405 refers to the thickness of the thickest portion of the porous layer 405 in the direction perpendicular to a main surface of light-transmitting plate 404. Specifically, it means the thickness of the porous layer 405 in valley portions of the microlens array 402.

A surface of the porous layer 405 adjacent to the light-transmitting plate can be flatter than a surface of the porous layer 405 adjacent to the microlens array. That is, the surface of the porous layer 405 on the light-transmitting plate side can be flatter than the surface of the porous layer 405 on the microlens array side (hereinafter, also referred to simply as a "lower surface").

Here, the lower surface of the porous layer 405 refers to an uneven surface of the porous layer 405 having protrusions and recesses corresponding to the protrusions and the recesses of the microlens array 402. That is, the unevenness of the upper surface of the porous layer 405 along the light-transmitting plate 404 can be smaller than the unevenness of the lower surface of the porous layer 405. From this point of view, the porous layer 405 can be referred to as a "planarizing film" that planarizes the unevenness of the microlens array 402.

When the porous layer 405 is used as a planarizing film as described above, the film thickness of the porous layer 405 is preferably 1.5 or more times, more preferably 3 or more times, the height difference between the protrusions and the recesses of the microlens array 402. The film thickness of the porous layer 405 may be 5 or more times the height difference between the protrusions and the recesses of the microlens array 402.

Specifically, the height difference between protrusions and recesses of the upper surface of the porous layer 405 is preferably 500 nm or less, more preferably 200 nm or less, even more preferably 100 nm or less. When the height difference between the protrusions and the recesses of the upper surface is larger than 500 nm, light may be scattered by the protrusions and the recesses present on the surface to reduce the transmittance. In addition, a space may be formed at the interface between the light-transmitting plate 404 and the porous layer 405 to allow moisture to enter the porous layer 405 through the space, thereby changing the refractive index or transmittance of the porous layer 405 to deteriorate the performance of the photoelectric conversion device.

Figure 4B:
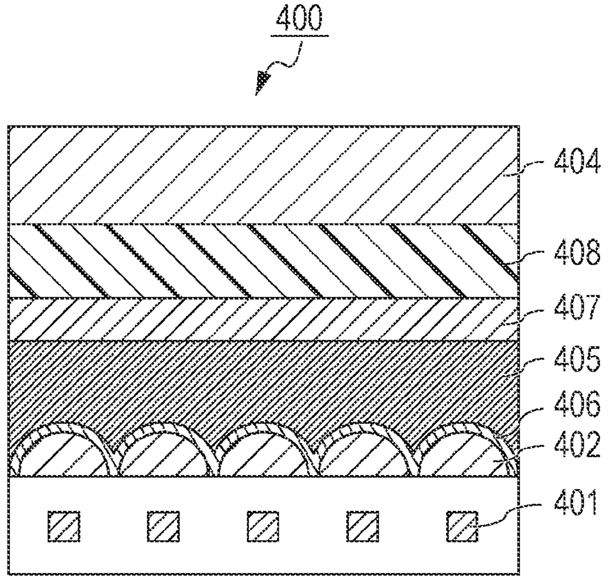
FIG. 4B illustrates a modified example of a photoelectric conversion device as an example of an article according to an embodiment of the present disclosure.

FIG. 4B is a cross-sectional view illustrating another configuration example of the photoelectric conversion device 400. An adhesive layer 408 composed of a resin is disposed between the porous layer 405 and the light-transmitting plate 404 to bond the porous layer 405 and the light-transmitting plate 404 to each other. If necessary, an antireflection layer 407 may be disposed between the porous layer 405 and the adhesive layer 408. An antireflection layer 406 may be disposed between the porous layer 405 and the microlens array 402, as needed.

The upper surface and the lower surface of the antireflection layer 406 have protrusions and recesses corresponding to the protrusions and the recesses of the microlens array 402. Each of the antireflection layers 406 and 407 may be thinner than the porous layer 405. The thickness of each of the antireflection layers 406 and 407 may be ¼ or less of the thickness of the porous layer 405.

Third Embodiment

Figure 5:
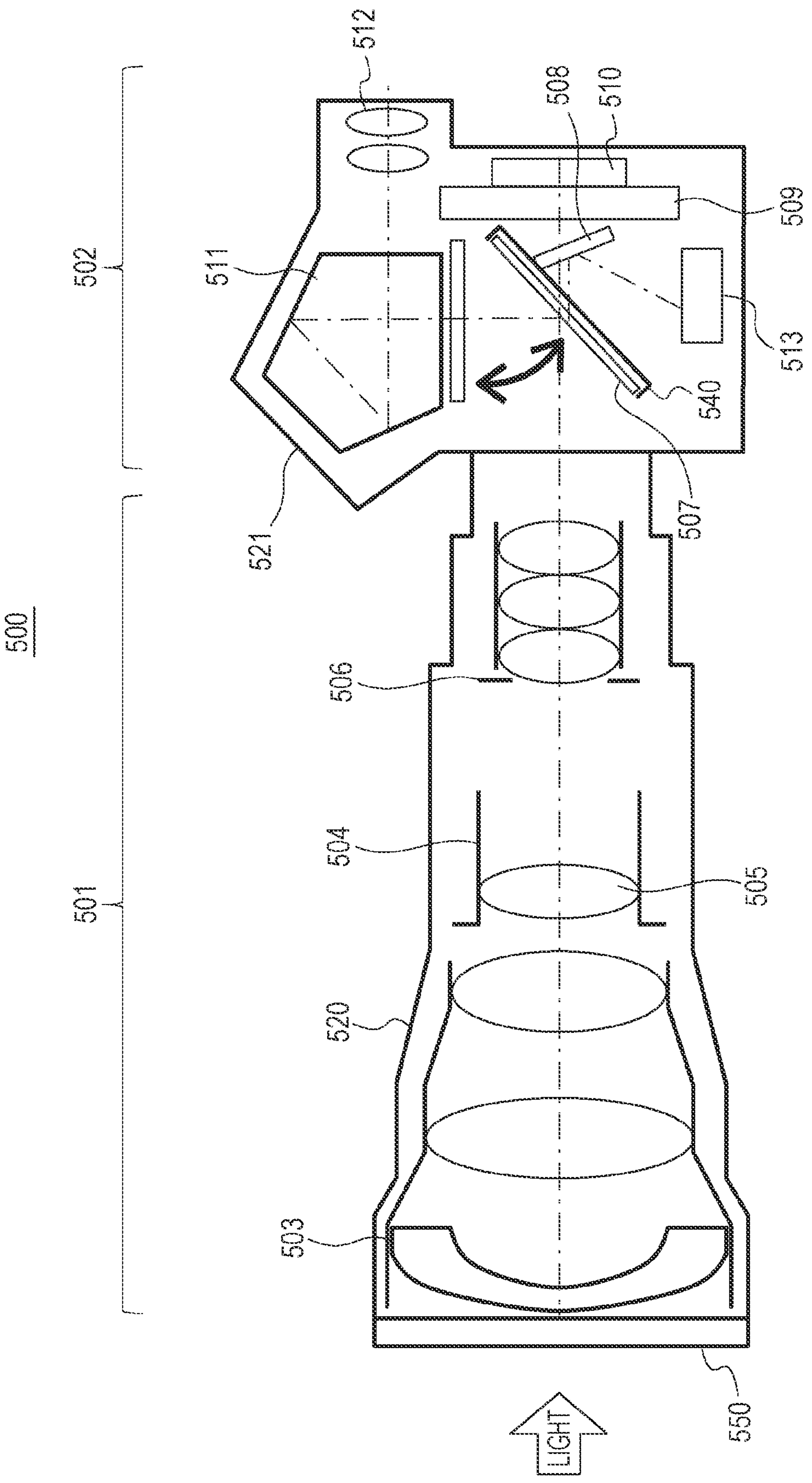
FIG. 5 is a schematic view of an image pickup apparatus as an example of an optical apparatus including an article according to an embodiment of the present disclosure.

FIG. 5 illustrates a configuration example of an image pickup apparatus 500 including a lens barrel (interchangeable lens) as an optical apparatus including the article according to an embodiment of the present disclosure. FIG. 5 illustrates a digital single-lens reflex camera to which the lens barrel (interchangeable lens) is coupled.

In an embodiment of the present disclosure, the optical apparatus indicates an apparatus including an optical system, for example, binoculars, a microscope, a semiconductor exposure apparatus, or an interchangeable lens.

The image pickup apparatus 500 according to an embodiment of the present disclosure refers to an image pickup apparatus, such as a digital still camera or a digital camcorder, an image pickup system, such as a robot or a drone on which the image pickup apparatus is mounted, or an electronic apparatus, such as a mobile phone, including an image pickup element that receives light passed through an optical element. Note that a module mounted on an electronic apparatus, such as a camera module, may be used as the image pickup apparatus.

In FIG. 5, a camera main body 502 and a lens barrel 501, which is an optical apparatus, are coupled to each other, and the lens barrel 501 is what is called an interchangeable lens that is detachable from the camera main body 502.

Light from a subject passes through an image pickup optical system including multiple lenses 503 and 505 arranged on the optical axis of the optical system in a housing 520 of the lens barrel 501, and is received by the image pickup element. The article according to an embodiment of the present disclosure can be used for the lenses included in the optical system or an image pickup element.

The lens 505 is supported by an inner barrel 504, and is movably supported by an outer barrel of the lens barrel 501 for focusing and zooming. For the duration of observation before capturing, light from a subject is reflected by a main mirror 507 in the housing of the camera main body 502 and passes through a prism 511. Then, a photographer sees the capturing image through a viewfinder lens 512. The main mirror 507 is, for example, a semi-transparent mirror. The light that has passed through the main mirror is reflected by a sub-mirror 508 toward an autofocusing (AF) unit 513. This reflected light is used for, for example, focusing. The main mirror 507 is mounted on and supported by a main mirror holder 540 using adhesion or the like. During capturing, the main mirror 507 and the sub-mirror 508 are moved to positions outside the optical path using a driving mechanism (not illustrated), a shutter 509 is opened, and the captured optical image incident from the lens barrel 501 is focused on an image pickup element 510. A diaphragm 506 is configured in such a manner that the brightness and the focal depth during capturing can be changed by adjusting the aperture area.

A lens filter 550 is disposed on the outermost side of the optical system, that is, at a position of the lens barrel 501 farthest from the camera main body 502.

For example, the lens filter 300 having the structure illustrated in FIG. 3 can be used as the lens filter 550, and the photoelectric conversion device 400 illustrated in FIG. 4A or 4B can be used as the image pickup element 510.

EXAMPLES

In each of Examples 1 to 18, a coating liquid for forming the porous layer 120 was prepared by the following method described below. A porous layer was formed on a substrate to produce the article 100 having the porous layer 120. The coating liquid and the resulting porous layer 120 were evaluated as described below.

Evaluation of Refractive Index of Porous Layer

Porous layers 120 containing particles were each formed on a polished surface of a glass substrate (synthetic quartz having a diameter of 30 mm and a thickness of 1 mm and having one polished surface) and a silicon wafer. A spectroscopic ellipsometer (VASE, available from J. A. Woollam Japan) was used. Light was incident on each porous layer 120. The reflected light was measured in the wavelength range of 380 nm to 800 nm, and the refractive indices were calculated. The refractive indices at a wavelength of 550 nm were evaluated according to the following criteria. The porous layer rated A or B is suitable as a low-refractive-index layer.

A: 1.23 or less

B: more than 1.23 and 1.30 or less

C: more than 1.30

The porous layer 120 was divided into a region adjacent to the substrate and a region opposite to the substrate with respect to a plane at a position corresponding to ½ of the average film thickness of the porous layer 120, and the refractive index of each of the regions was evaluated by the above-described method. Specifically, an optical model was created on the assumption that the porous layer 120 had a structure formed of two layers each having a thickness of ½ of the average film thickness of the porous layer 120. The refractive index of each region was calculated by performing fitting with respect to the refractive index of the porous layer 120 measured with the spectroscopic ellipsometer.

The difference in refractive index between the region adjacent to the substrate and the region opposite to the substrate was calculated as the difference in refractive index in the film thickness direction, and evaluated according to the following criteria. The porous layer rated A or B has a sufficiently small difference in film density.

A: 0.003 or less

B: more than 0.003 and 0.01 or less

C: more than 0.01

Evaluation of Crack in Porous Layer

A surface of the porous layer opposite to the surface adjacent to the substrate was observed at a magnification of 300× with a digital microscope (VHX 5000, available from Keyence Corporation) to evaluate the presence or absence of a crack.

Evaluation of Film Thickness of Porous Layer

A cross section of the resulting porous layer was observed with a scanning electron microscope. Film thicknesses were measured at multiple positions. The average value thereof was calculated and defined as the film thickness.

Example 1

Isopropyl alcohol was distilled off under heating from 400 g of a dispersion of chain-like silicon oxide particles in isopropyl alcohol (IPA-ST-UP, available from Nissan Chemical Industries, Ltd., particle diameter: 40 nm, solid content concentration: 15%) while 1-propoxy-2-propanol was added to the dispersion. Isopropyl alcohol was distilled off until the solid content concentration reached 30.0% by mass to prepare 200 g of a 1P2P solvent-substituted liquid containing the chain-like silicon oxide particles (hereinafter, referred to as a "solvent-substituted liquid 1"). A dispersion of hollow silicon oxide particles in isopropyl alcohol was added to the resulting solvent-substituted liquid 1 in such a manner that the ratio by mass of the chain-like silicon oxide particles to the hollow silicon oxide particles was 19:1, thereby preparing a dispersion 1. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

Into another container, 12.48 g of ethyl silicate was charged. Then 13.82 g of ethanol and an aqueous nitric acid solution (concentration: 3%) were added thereto. The resulting mixture was stirred at room temperature for 10 hours to prepare a silica sol 1 (solid content concentration: 11.5% by mass). Analysis by gas chromatography revealed that ethyl silicate, serving as the raw material, had completely reacted.

The dispersion 1 was diluted with ethyl lactate so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 1 containing the chain-like silicon oxide particles and the hollow silicon oxide particles.

The resulting coating liquid 1 was dropped onto a glass substrate and a silicon wafer and then formed into films with a spin coater. Each of the films was baked on a hot plate at 120° C. for 5 minutes to produce an article including a porous layer. The film thickness was 1.4 μm.

Example 2

A dispersion of hollow silicon oxide particles in isopropyl alcohol was added to the solvent-substituted liquid 1 in such a manner that the ratio by mass of the chain-like silicon oxide particles to the hollow silicon oxide particles was 9:1, thereby preparing a dispersion 2. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The dispersion 2 was diluted with ethyl lactate so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 2 containing the chain-like silicon oxide particles and the hollow silicon oxide particles.

The resulting coating liquid 2 was dropped onto a glass substrate and a silicon wafer and then formed into films with a spin coater. Each of the films was baked on a hot plate at 120° C. for 5 minutes to produce an article including a porous layer. The film thickness was 1.5 μm.

Example 3

A dispersion of hollow silicon oxide particles in isopropyl alcohol was added to 320 g of a dispersion of chain-like silicon oxide particles in isopropyl alcohol in such a manner that the ratio by mass of the chain-like silicon oxide particles to the hollow silicon oxide particles was 4:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 2"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 2 was diluted with ethyl lactate so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 3 containing the chain-like silicon oxide particles and the hollow silicon oxide particles.

The resulting coating liquid 3 was dropped onto a glass substrate and a silicon wafer and then formed into films with a spin coater. Each of the films was baked on a hot plate at 120° C. for 5 minutes to produce an article including a porous layer. The film thickness was 1.7 μm.

Example 4

A dispersion of hollow silicon oxide particles in isopropyl alcohol was added to 320 g of a dispersion of chain-like silicon oxide particles in isopropyl alcohol in such a manner that the ratio by mass of the chain-like silicon oxide particles to the hollow silicon oxide particles was 16:3. A dispersion of solid silicon oxide particles in propylene glycol monomethyl ether was added thereto in such a manner that the ratio by mass of the chain-like silicon oxide particles to the solid silicon oxide particles was 16:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 3"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used. As the dispersion of the solid silicon oxide particles in propylene glycol monomethyl ether, PGM-ST (particle diameter: 10 nm, solid content concentration: 30%) available from Nissan Chemical Industries, Ltd. was used.

The solvent-substituted liquid 3 was diluted with ethyl lactate so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 4 containing the chain-like silicon oxide particles, the hollow silicon oxide particles, and the solid silicon oxide particles.

The resulting coating liquid 4 was dropped onto a glass substrate and a silicon wafer and then formed into films with a spin coater. Each of the films was baked on a hot plate at 120° C. for 5 minutes to produce an article including a porous layer. The film thickness was 1.4 μm.

Example 5

A dispersion of hollow silicon oxide particles in isopropyl alcohol was added to 340 g of a dispersion of chain-like silicon oxide particles in isopropyl alcohol in such a manner that the ratio by mass of the chain-like silicon oxide particles to the hollow silicon oxide particles was 17:2. An aqueous dispersion of cocoon-shaped silicon oxide particles was added thereto in such a manner that the ratio by mass of the chain-like silicon oxide particles to the cocoon-shaped silicon oxide particles was 17:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 4"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used. As the aqueous dispersion of the cocoon-shaped silicon oxide particles, PL-1 (particle diameter: 15 nm, solid content concentration: 12%) available from Fuso Chemical Co., Ltd. was used.

The solvent-substituted liquid 4 was diluted with ethyl lactate so as to have a solid content concentration of 20.0% by mass. Then the silica sol 1 was added thereto in such a manner that the ratio of the silicon oxide particles to a silica sol component was 25:1. The resulting mixture was stirred at room temperature for 2 hours to prepare a coating liquid 5 containing the chain-like silicon oxide particles, the hollow silicon oxide particles, and the cocoon-shaped silicon oxide particles.

The resulting coating liquid 5 was dropped onto a glass substrate and a silicon wafer and then formed into films with a spin coater. Each of the films was baked on a hot plate at 120° C. for 5 minutes to produce an article including a porous layer. The film thickness was 1.2 μm.

Example 6

A dispersion of hollow silicon oxide particles in isopropyl alcohol was added to 340 g of a dispersion of chain-like silicon oxide particles in isopropyl alcohol in such a manner that the ratio by mass of the chain-like silicon oxide particles to the hollow silicon oxide particles was 17:1. A dispersion of solid silicon oxide particles in propylene glycol monomethyl ether was added thereto in such a manner that the ratio by mass of the chain-like silicon oxide particles to the solid silicon oxide particles was 17:2. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 5"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used. As the dispersion of the solid silicon oxide particles in propylene glycol monomethyl ether, PGM-ST (particle diameter: 10 nm, solid content concentration: 30%) available from Nissan Chemical Industries, Ltd. was used.

The solvent-substituted liquid 5 was diluted with ethyl lactate so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 6 containing the chain-like silicon oxide particles, the hollow silicon oxide particles, and the solid silicon oxide particles.

The resulting coating liquid 6 was dropped onto a glass substrate and a silicon wafer and then formed into films with a spin coater. Each of the films was baked on a hot plate at 120° C. for 5 minutes to produce an article including a porous layer. The film thickness was 1.0 μm.

Example 7

A dispersion of hollow silicon oxide particles in isopropyl alcohol was added to 240 g of a dispersion of chain-like silicon oxide particles in isopropyl alcohol in such a manner that the ratio by mass of the chain-like silicon oxide particles to the hollow silicon oxide particles was 3:2. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 6"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 6 was diluted with 3-methoxy-1-butanol so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 7 containing the chain-like silicon oxide particles and the hollow silicon oxide particles.

The resulting coating liquid 7 was dropped onto a glass substrate and a silicon wafer and then formed into films with a spin coater. Each of the films was baked on a hot plate at 120° C. for 5 minutes to produce an article including a porous layer. The film thickness was 1.1 μm.

Example 8

An aqueous dispersion of cocoon-shaped silicon oxide particles was added to 380 g of a dispersion of chain-like silicon oxide particles in isopropyl alcohol in such a manner that the ratio by mass of the chain-like silicon oxide particles to the cocoon-shaped silicon oxide particles was 19:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 7"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the aqueous dispersion of the cocoon-shaped silicon oxide particles, PL-1 (particle diameter: 15 nm, solid content concentration: 12%) available from Fuso Chemical Co., Ltd. was used.

The solvent-substituted liquid 7 was diluted with ethyl lactate so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 8 containing the chain-like silicon oxide particles and the cocoon-shaped silicon oxide particles.

The resulting coating liquid 8 was dropped onto a glass substrate and a silicon wafer and then formed into films with a spin coater. Each of the films was baked on a hot plate at 120° C. for 5 minutes to produce an article including a porous layer. The film thickness was 1.1 μm.

Example 9

A dispersion of solid silicon oxide particles in propylene glycol monomethyl ether was added to 360 g of a dispersion of chain-like silicon oxide particles in isopropyl alcohol in such a manner that the ratio by mass of the chain-like silicon oxide particles to the solid silicon oxide particles was 9:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 8"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the solid silicon oxide particles in propylene glycol monomethyl ether, PGM-ST (particle diameter: 10 nm, solid content concentration: 30%) available from Nissan Chemical Industries, Ltd. was used.

The solvent-substituted liquid 8 was diluted with ethyl lactate so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 9 containing the chain-like silicon oxide particles and the solid silicon oxide particles.

The resulting coating liquid 9 was dropped onto a glass substrate and a silicon wafer and then formed into films with a spin coater. Each of the films was baked on a hot plate at 120° C. for 5 minutes to produce an article including a porous layer. The film thickness was 1.1 μm.

Example 10

A dispersion of solid silicon oxide particles in propylene glycol monomethyl ether was added to 320 g of a dispersion of chain-like silicon oxide particles in isopropyl alcohol in such a manner that the ratio by mass of the chain-like silicon oxide particles to the solid silicon oxide particles was 4:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 9"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the solid silicon oxide particles in propylene glycol monomethyl ether, PGM-ST (particle diameter: 10 nm, solid content concentration: 30%) available from Nissan Chemical Industries, Ltd. was used.

The solvent-substituted liquid 9 was diluted with ethyl lactate so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 10 containing the chain-like silicon oxide particles and the solid silicon oxide particles.

The resulting coating liquid 10 was dropped onto a glass substrate and a silicon wafer and then formed into films with a spin coater. Each of the films was baked on a hot plate at 120° C. for 5 minutes to produce an article including a porous layer. The film thickness was 1.4 μm.

Example 11

A dispersion of hollow silicon oxide particles in isopropyl alcohol was added to 390 g of a dispersion of chain-like silicon oxide particles in isopropyl alcohol in such a manner that the ratio by mass of the chain-like silicon oxide particles to the hollow silicon oxide particles was 49:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 10"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 10 was diluted with ethyl lactate so as to have a solid content concentration of 20.0% by mass. Then the silica sol 1 was added thereto in such a manner that the ratio of the silicon oxide particles to a silica sol component was 100:1. The resulting mixture was stirred at room temperature for 2 hours to prepare a coating liquid 11 containing the chain-like silicon oxide particles and the hollow silicon oxide particles.

The resulting coating liquid 11 was dropped onto a glass substrate and a silicon wafer and then formed into films with a spin coater. Each of the films was baked on a hot plate at 120° C. for 5 minutes to produce an article including a porous layer. The film thickness was 1.2 μm.

Example 12

A dispersion of hollow silicon oxide particles in isopropyl alcohol was added to 390 g of a dispersion of chain-like silicon oxide particles in isopropyl alcohol in such a manner that the ratio by mass of the chain-like silicon oxide particles to the hollow silicon oxide particles was 19:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 11"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 11 was diluted with 3-methoxy-1-propanol so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 12 containing the chain-like silicon oxide particles and the hollow silicon oxide particles.

The resulting coating liquid 12 was dropped onto a glass substrate and a silicon wafer and then formed into films with a spin coater. Each of the films was baked on a hot plate at 120° C. for 5 minutes to produce an article including a porous layer. The film thickness was 1.6 μm.

Example 13

The solvent-substituted liquid 11 was diluted with ethyl lactate so as to have a solid content concentration of 20.0% by mass. Then the silica sol 1 was added thereto in such a manner that the ratio of the silicon oxide particles to a silica sol component was 50:1.

The resulting mixture was stirred at room temperature for 2 hours to prepare a coating liquid 13 containing the chain-like silicon oxide particles and the hollow silicon oxide particles.

The resulting coating liquid 13 was dropped onto a glass substrate and a silicon wafer and then formed into films with a spin coater. Each of the films was baked on a hot plate at 120° C. for 5 minutes to produce an article including a porous layer. The film thickness was 2.8 μm.

Example 14

A dispersion of hollow silicon oxide particles in isopropyl alcohol was added to 270 g of a dispersion of chain-like silicon oxide particles in methanol in such a manner that the ratio by mass of the chain-like silicon oxide particles to the hollow silicon oxide particles was 9:1. Methanol and isopropyl alcohol were distilled off under heating while 1-propoxy-2-propanol was added thereto. Methanol and isopropyl alcohol were distilled off until the solid content concentration reached 30.0% by mass to prepare 200 g of a 1P2P solvent-substituted liquid containing the silicon oxide particles (hereinafter, referred to as a "solvent-substituted liquid 12"). As the dispersion of the chain-like silicon oxide particles in methanol, MA-ST-UP (particle diameter: 40 nm, solid content concentration: 20%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 12 was diluted with ethyl lactate so as to have a solid content concentration of 20.0% by mass. Then the silica sol 1 was added thereto in such a manner that the ratio of the silicon oxide particles to a silica sol component was 50:1.

The resulting mixture was stirred at room temperature for 2 hours to prepare a coating liquid 14 containing the chain-like silicon oxide particles and the hollow silicon oxide particles.

The resulting coating liquid 14 was dropped onto a glass substrate and a silicon wafer and then formed into films with a spin coater. Each of the films was baked on a hot plate at 120° C. for 5 minutes to produce an article including a porous layer. The film thickness was 1.2 μm.

Example 15

A dispersion of hollow silicon oxide particles in isopropyl alcohol was added to 390 g of a dispersion of chain-like silicon oxide particles in isopropyl alcohol in such a manner that the ratio by mass of the chain-like silicon oxide particles to the hollow silicon oxide particles was 49:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 13"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 1110 (average particle diameter: about 50 nm, shell thickness: about 10 nm, solid content concentration: 20.5% by mass) available from JGC Catalysts and Chemicals Ltd. was used.

The solvent-substituted liquid 13 was diluted with ethyl lactate so as to have a solid content concentration of 20.0% by mass. Then the silica sol 1 was added thereto in such a manner that the ratio of the silicon oxide particles to a silica sol component was 100:1. The resulting mixture was stirred at room temperature for 2 hours to prepare a coating liquid 15 containing the chain-like silicon oxide particles and the hollow silicon oxide particles.

The resulting coating liquid 15 was dropped onto a glass substrate and a silicon wafer and then formed into films with a spin coater. Each of the films was baked on a hot plate at 120° C. for 5 minutes to produce an article including a porous layer. The film thickness was 1.4 μm.

Example 16

A dispersion of hollow silicon oxide particles in isopropyl alcohol was added to 320 g of a dispersion of chain-like silicon oxide particles in isopropyl alcohol in such a manner that the ratio by mass of the chain-like silicon oxide particles to the hollow silicon oxide particles was 4:1. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 14"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 1110 (average particle diameter: about 50 nm, shell thickness: about 10 nm, solid content concentration: 20.5% by mass) available from JGC Catalysts and Chemicals Ltd. was used.

The solvent-substituted liquid 14 was diluted with 3-methoxy-1-butanol so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 16 containing the chain-like silicon oxide particles and the hollow silicon oxide particles.

The resulting coating liquid 16 was dropped onto a glass substrate and a silicon wafer and then formed into films with a spin coater. Each of the films was baked on a hot plate at 120° C. for 5 minutes to produce an article including a porous layer. The film thickness was 1.6 μm.

Example 17

A dispersion of hollow silicon oxide particles in isopropyl alcohol was added to 390 g of a dispersion of chain-like silicon oxide particles in methanol in such a manner that the ratio by mass of the chain-like silicon oxide particles to the hollow silicon oxide particles was 49:1. Methanol and isopropyl alcohol were distilled off under heating while 1-propoxy-2-propanol was added thereto. Methanol and isopropyl alcohol were distilled off until the solid content concentration reached 30.0% by mass to prepare 200 g of a 1P2P solvent-substituted liquid containing the silicon oxide particles (hereinafter, referred to as a "solvent-substituted liquid 15"). As the dispersion of the chain-like silicon oxide particles in methanol, MA-ST-UP (particle diameter: 40 nm, solid content concentration: 20%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 15 was diluted with 3-methoxy-1-butanol so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 17 containing the chain-like silicon oxide particles and the hollow silicon oxide particles.

The resulting coating liquid 17 was dropped onto a glass substrate and a silicon wafer and then formed into films with a spin coater. Each of the films was baked on a hot plate at 120° C. for 5 minutes to produce an article including a porous layer. The film thickness was 2.1 μm.

Example 18

A dispersion of hollow silicon oxide particles in isopropyl alcohol was added to 360 g of a dispersion of chain-like silicon oxide particles in methanol in such a manner that the ratio by mass of the chain-like silicon oxide particles to the hollow silicon oxide particles was 9:1. Methanol and isopropyl alcohol were distilled off under heating while 1-propoxy-2-propanol was added thereto. Methanol and isopropyl alcohol were distilled off until the solid content concentration reached 30.0% by mass to prepare 200 g of a 1P2P solvent-substituted liquid containing the silicon oxide particles (hereinafter, referred to as a "solvent-substituted liquid 16"). As the dispersion of the chain-like silicon oxide particles in methanol, MA-ST-UP (particle diameter: 40 nm, solid content concentration: 20%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 16 was diluted with 3-methoxy-1-butanol so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 18 containing the chain-like silicon oxide particles and the hollow silicon oxide particles.

The resulting coating liquid 18 was dropped onto a glass substrate and a silicon wafer and then formed into films with a spin coater. Each of the films was baked on a hot plate at 120° C. for 5 minutes to produce an article including a porous layer containing particles. The film thickness was 1.5 μm.

Comparative Example 1

Isopropyl alcohol was distilled off under heating from 440 g of a dispersion of hollow silicon oxide particles in isopropyl alcohol while 1-propoxy-2-propanol was added to the dispersion. Isopropyl alcohol was distilled off until the solid content concentration reached 30.0% by mass to prepare 300 g of a 1P2P solvent-substituted liquid containing the silicon oxide particles (hereinafter, referred to as a "solvent-substituted liquid 17"). As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 17 was diluted with ethyl lactate so as to have a solid content concentration of 20.0% by mass. Then the silica sol 1 was added thereto in such a manner that the ratio of the silicon oxide particles to a silica sol component was 100:1. The resulting mixture was stirred at room temperature for 2 hours to prepare a coating liquid 19 containing the hollow silicon oxide particles.

The resulting coating liquid 19 was dropped onto a glass substrate and a silicon wafer and then formed into films with a spin coater. Each of the films was baked on a hot plate at 120° C. for 5 minutes to produce an article including a porous layer containing particles. The film thickness was 1.4 μm.

Comparative Example 2

Isopropyl alcohol was distilled off under heating from 400 g of a dispersion of chain-like silicon oxide particles in isopropyl alcohol (IPA-ST-UP, available from Nissan Chemical Industries, Ltd., particle diameter: 40 nm, solid content concentration: 15%) while 1-propoxy-2-propanol was added to the dispersion. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 18").

The solvent-substituted liquid 18 was diluted with ethyl lactate so as to have a solid content concentration of 20.0% by mass. Then the silica sol 1 was added thereto in such a manner that the ratio of the silicon oxide particles to a silica sol component was 25:1.

The resulting mixture was stirred at room temperature for 2 hours to prepare a coating liquid 20 containing the chain-like silicon oxide particles.

The resulting coating liquid 20 was dropped onto a glass substrate and a silicon wafer and then formed into films with a spin coater. Each of the films was baked on a hot plate at 120° C. for 5 minutes to produce an article including a porous layer. The film thickness was 1.5 μm.

Comparative Example 3

Then 1-propoxy-2-propanol and ethyl lactate were added to a dispersion of solid silicon oxide particles in propylene glycol monomethyl ether in a ratio of 7:3 in such a manner that the solid content concentration was 20.0% by mass, thereby preparing a dispersion 3. As the dispersion of the solid silicon oxide particles in propylene glycol monomethyl ether, PGM-ST (particle diameter: 10 nm, solid content concentration: 30%) available from Nissan Chemical Industries, Ltd. was used.

The silica sol 1 was added to the dispersion 3 in such a manner that the ratio of the silicon oxide particles to a silica sol component was 25:1. The resulting mixture was stirred at room temperature for 2 hours to prepare a coating liquid 21 containing the solid silicon oxide particles.

The resulting coating liquid 21 was dropped onto a glass substrate and a silicon wafer and then formed into films with a spin coater. Each of the films was baked on a hot plate at 120° C. for 5 minutes to produce an article including a porous layer. The film thickness was 1.0 μm.

Comparative Example 4

A dispersion of hollow silicon oxide particles in isopropyl alcohol was added to 80 g of a dispersion of chain-like silicon oxide particles in isopropyl alcohol in such a manner that the ratio by mass of the chain-like silicon oxide particles to the hollow silicon oxide particles was 1:4. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 19"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 19 was diluted with 1-ethoxy-2-propanol so as to have a solid content concentration of 20.0% by mass. Then the silica sol 1 was added thereto in such a manner that the ratio of the silicon oxide particles to a silica sol component was 50:1. The resulting mixture was stirred at room temperature for 2 hours to prepare a coating liquid 22 containing the chain-like silicon oxide particles and the hollow silicon oxide particles.

The resulting coating liquid 22 was dropped onto a glass substrate and a silicon wafer and then formed into films with a spin coater. Each of the films was baked on a hot plate at 120° C. for 5 minutes to produce an article including a porous layer. The film thickness was 1.6 μm.

Comparative Example 5

A dispersion of hollow silicon oxide particles in isopropyl alcohol was added to 40 g of a dispersion of chain-like silicon oxide particles in methanol in such a manner that the ratio by mass of the chain-like silicon oxide particles to the hollow silicon oxide particles was 1:9. Methanol and isopropyl alcohol were distilled off under heating while 1-propoxy-2-propanol was added thereto. Methanol and isopropyl alcohol were distilled off until the solid content concentration reached 30.0% by mass to prepare 200 g of a 1P2P solvent-substituted liquid containing the silicon oxide particles (hereinafter, referred to as a "solvent-substituted liquid 20"). As the dispersion of the chain-like silicon oxide particles in methanol, MA-ST-UP (particle diameter: 40 nm, solid content concentration: 20%) available from Nissan Chemical Industries, Ltd. was used. As the dispersion of the hollow silicon oxide particles in isopropyl alcohol, Thrulya 1110 (average particle diameter: about 50 nm, shell thickness: about 10 nm, solid content concentration: 20.5% by mass) available from JGC Catalysts and Chemicals Ltd. was used.

The solvent-substituted liquid 20 was diluted with ethyl lactate so as to have a solid content concentration of 20.0% by mass. Then the silica sol 1 was added thereto in such a manner that the ratio of the silicon oxide particles to a silica sol component was 50:1.

The resulting mixture was stirred at room temperature for 2 hours to prepare a coating liquid 23 containing the chain-like silicon oxide particles and the hollow silicon oxide particles.

The resulting coating liquid 23 was dropped onto a glass substrate and a silicon wafer and then formed into films with a spin coater. Each of the films was baked on a hot plate at 120° C. for 5 minutes to produce an article including a porous layer containing particles. The film thickness was 1.5 μm.

Comparative Example 6

A dispersion of hollow silicon oxide particles in isopropyl alcohol was added to 20 g of a dispersion of chain-like silicon oxide particles in isopropyl alcohol in such a manner that the ratio by mass of the chain-like silicon oxide particles to the hollow silicon oxide particles was 1:19. Isopropyl alcohol was distilled off under heating while 1-propoxy-2-propanol was added thereto. Isopropyl alcohol was distilled off until the solid content concentration reached 30.0% by mass to prepare 200 g of a 1P2P solvent-substituted liquid containing the silicon oxide particles (hereinafter, referred to as a "solvent-substituted liquid 21"). As the dispersion of the chain-like silicon oxide particles in isopropyl alcohol, IPA-ST-UP (particle diameter: 40 nm, solid content concentration: 15%) available from Nissan Chemical Industries, Ltd. was used. As the dispersion of the hollow silicon oxide particles in isopropyl alcohol, Thrulya 4110 (average particle diameter: about 60 nm, shell thickness: about 10 nm, solid content concentration: 20.5% by mass) available from JGC Catalysts and Chemicals Ltd. was used.

The solvent-substituted liquid 21 was diluted with ethyl lactate so as to have a solid content concentration of 20.0% by mass. Then the silica sol 1 was added thereto in such a manner that the ratio of the silicon oxide particles to a silica sol component was 50:1.

The resulting mixture was stirred at room temperature for 2 hours to prepare a coating liquid 24 containing the chain-like silicon oxide particles and the hollow silicon oxide particles.

The resulting coating liquid 24 was dropped onto a glass substrate and a silicon wafer and then formed into films with a spin coater. Each of the films was baked on a hot plate at 120° C. for 5 minutes to produce an article including a porous layer. The film thickness was 1.6 μm.

Comparative Example 7

A dispersion of solid silicon oxide particles in propylene glycol monomethyl ether was mixed with a dispersion of chain-like silicon oxide particles in propylene glycol monomethyl ether in a ratio of 7:3 to prepare a dispersion 4.

Propylene glycol monomethyl ether was added to the dispersion 4 in such a manner that the solid content concentration was 20.0%. Then the silica sol 1 was added thereto in such a manner that the ratio of the silicon oxide particles to a silica sol component was 25:1. The resulting mixture was stirred at room temperature for 2 hours to prepare a coating liquid 25 containing the solid silicon oxide particles. As the dispersion of the chain-like silicon oxide particles in propylene glycol monomethyl ether, PGM-ST-UP (particle diameter: 40 nm, solid content concentration: 15%) available from Nissan Chemical Industries, Ltd. was used. As the dispersion of the solid silicon oxide particles in propylene glycol monomethyl ether, PGM-ST (particle diameter: 10 nm, solid content concentration: 30%) available from Nissan Chemical Industries, Ltd. was used.

The resulting coating liquid 25 was dropped onto a glass substrate and a silicon wafer and then formed into films with a spin coater. Each of the films was baked on a hot plate at 120° C. for 5 minutes to produce an article including a porous layer. The film thickness was 1.9 μm.

Table 1 collectively presents the mixing ratios of the chain-like particles and the particles other than the chain-like particles contained in the inorganic particles and the evaluation results of the physical properties of the films in Examples 1 to 18 and Comparative examples 1 to 7. In Table 1, for simplification, a region of the porous layer 120 extending from the position of half of the film thickness of the porous layer 120 to the side of the porous layer 120 adjacent to the substrate is described as a lower layer, and a region of the porous layer 120 extending from the position of half of the film thickness of the porous layer 120 to the side of the porous layer 120 remote from the substrate is described as an upper layer.

TABLE 1

| | Silica particles | | | Volume fraction | Water-soluble hydroxy group-containing solvent with 4 to 6 carbon atoms | |
|---|---|---|---|---|---|---|
| | Particle (i) | Particle (ii) | Particle (iii) | (i):(ii):(iii) | Solvent 1 | Solvent 2 |
| Example 1 | chain-like | hollow | — | 95:5:0 | 1-propoxy-2-propanol | ethyl lactate |
| Example 2 | chain-like | hollow | — | 90:10:0 | 1-propoxy-2-propanol | ethyl lactate |
| Example 3 | chain-like | hollow | — | 80:20:0 | 1-propoxy-2-propanol | ethyl lactate |
| Example 4 | chain-like | hollow | solid | 80:15:5 | 1-propoxy-2-propanol | ethyl lactate |
| Example 5 | chain-like | hollow | cocoon-shaped | 85:10:5 | 1-propoxy-2-propanol | ethyl lactate |
| Example 6 | chain-like | hollow | solid | 85:5:10 | 1-propoxy-2-propanol | ethyl lactate |
| Example 7 | chain-like | hollow | — | 60:40:0 | 1-propoxy-2-propanol | 3-methoxy-1-butanol |
| Example 8 | chain-like | cocoon-shaped | — | 95:5:0 | 1-propoxy-2-propanol | ethyl lactate |
| Example 9 | chain-like | solid | — | 90:10:0 | 1-propoxy-2-propanol | ethyl lactate |
| Example 10 | chain-like | solid | — | 80:20:0 | 1-propoxy-2-propanol | ethyl lactate |
| Example 11 | chain-like | hollow | — | 98:2:0 | 1-propoxy-2-propanol | ethyl lactate |
| Example 12 | chain-like | hollow | — | 95:5:0 | 1-propoxy-2-propanol | 3-methoxy-1-butanol |
| Example 13 | chain-like | hollow | — | 95:5:0 | 1-propoxy-2-propanol | ethyl lactate |
| Example 14 | chain-like | hollow | — | 90:10:0 | 1-propoxy-2-propanol | ethyl lactate |
| Example 15 | chain-like | hollow | — | 95:5:0 | 1-propoxy-2-propanol | ethyl lactate |
| Example 16 | chain-like | hollow | — | 80:20:0 | 1-propoxy-2-propanol | 3-methoxy-1-butanol |
| Example 17 | chain-like | hollow | — | 95:5:0 | 1-propoxy-2-propanol | 3-methoxy-1-butanol |
| Example 18 | chain-like | hollow | — | 90:10:0 | 1-propoxy-2-propanol | 3-methoxy-1-butanol |
| Comparative example 1 | hollow | — | — | 100:0:0 | 1-propoxy-2-propanol | ethyl lactate |
| Comparative example 2 | chain-like | — | — | 100:0:0 | 1-propoxy-2-propanol | ethyl lactate |
| Comparative example 3 | solid | — | — | 100:0:0 | 1-propoxy-2-propanol | ethyl lactate |
| Comparative example 4 | chain-like | hollow | — | 20:80:0 | 1-propoxy-2-propanol | 1-ethoxy-2-propanol |
| Comparative example 5 | chain-like | hollow | — | 10:90:0 | 1-propoxy-2-propanol | ethyl lactate |

TABLE 1-continued

| | | | | | | |
|---|---|---|---|---|---|---|
| Comparative example 6 | chain-like | hollow | — | 5:95:0 | 1-propoxy-2-propanol | 1-ethoxy-2-propanol |
| Comparative example 7 | chain-like | solid | — | 70:30:0 | — | — |

| | Proportion of water-soluble hydroxy group-containing | Physical property of film | | | |
|---|---|---|---|---|---|
| | solvent with 4 to 6 carbon atoms to solvent in coating liquid [% by mass] | Crack | Refractive index (at 550 nm) | Film thickness [μm] | Difference in refractive index between upper layer and lower layer |
| Example 1 | 30 | no | A (1.22) | 1.4 | A (0.002) |
| Example 2 | 50 | no | A (1.21) | 1.5 | A (0.003) |
| Example 3 | 30 | no | A (1.20) | 1.7 | B (0.004) |
| Example 4 | 45 | no | A (1.21) | 1.4 | A (0.003) |
| Example 5 | 30 | no | A (1.21) | 1.2 | B (0.004) |
| Example 6 | 35 | no | A (1.22) | 1.0 | A (0.003) |
| Example 7 | 50 | no | A (1.19) | 1.1 | B (0.005) |
| Example 8 | 35 | no | A (1.23) | 1.1 | A (0.002) |
| Example 9 | 30 | no | A (1.23) | 1.1 | A (0.002) |
| Example 10 | 30 | no | B (1.24) | 1.4 | A (0.003) |
| Example 11 | 30 | no | A (1.23) | 1.2 | A (0.002) |
| Example 12 | 35 | no | A (1.22) | 1.6 | A (0.002) |
| Example 13 | 40 | no | A (1.22) | 2.8 | B (0.005) |
| Example 14 | 30 | no | A (1.22) | 1.2 | A (0.003) |
| Example 15 | 30 | no | A (1.23) | 1.4 | A (0.002) |
| Example 16 | 45 | no | A (1.21) | 1.6 | B (0.005) |
| Example 17 | 35 | no | A (1.22) | 2.1 | A (0.002) |
| Example 18 | 35 | no | A (1.22) | 1.5 | A (0.002) |
| Comparative example 1 | 30 | yes | A (1.17) | 1.4 | A (0.002) |
| Comparative example 2 | 30 | yes | B (1.24) | 1.5 | A (0.002) |
| Comparative example 3 | 15 | yes | C (1.35) | 1.0 | A (0.002) |
| Comparative example 4 | 35 | yes | A (1.18) | 1.6 | A (0.002) |
| Comparative example 5 | 25 | yes | A (1.18) | 1.5 | A (0.003) |
| Comparative example 6 | 30 | yes | A (1.18) | 1.6 | A (0.003) |
| Comparative example 7 | 0 | yes | B (1.26) | 1.6 | C (0.012) |

The results presented in Table 1 indicated that in each of Examples 1 to 18 in which the inorganic particles included the chain-like particles and the particles other than the chain-like particles and the volume fraction of the chain-like particles based on the inorganic particles was 55% or more and 95% or less, the porous layer having no crack was formed even at a film thickness of 1.0 μm or more. The resulting porous layer was found to be a low-refractive-index film having a refractive index of 1.3 or less.

In each of Comparative examples 1 to 6 in which the proportion of the chain-like particles based on the inorganic particles was outside the range of 55% to 95%, cracking occurred even when the difference in refractive index between the region of the porous layer 120 extending from the position of half of the film thickness of the porous layer 120 to the side of the porous layer 120 adjacent to the substrate and the region of the porous layer 120 extending from the position of half of the film thickness of the porous layer 120 to the side of the porous layer 120 remote from the substrate was 0.01 or less.

In Comparative Example 7 in which the inorganic particles included the chain-like particles and the particles other than the chain-like particles and the volume fraction of the chain-like particles based on the inorganic particles was 55% or more and 95% or less, the coating liquid did not contain a water-soluble hydroxy group-containing solvent having 4 to 6 carbon atoms in an amount of 30% by mass to 80% by mass of the solvent. Thus, the difference in refractive index between the region of the porous layer 120 extending from the position of half of the film thickness of the porous layer 120 to the side of the porous layer 120 adjacent to the substrate and the region of the porous layer 120 extending from the position of half of the film thickness of the porous layer 120 to the side of the porous layer 120 remote from the substrate was more than 0.01, and cracking occurred. It is considered that since the difference in refractive index in the film was large, stress was applied to a portion having a difference in film density, thereby causing cracking.

According to an embodiment of the present disclosure, it is possible to provide the article including the porous layer in which the occurrence of cracking is inhibited regardless of its film thickness.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-070826, filed Apr. 22, 2022, which is hereby incorporated by reference herein in its entirety.

What is claimed is:

1. An article, comprising:

a substrate; and a porous layer disposed over the substrate, the porous layer containing inorganic particles bound by an inorganic binder, wherein the inorganic particles include chain-like particles and particles other than the chain-like particles, and a volume fraction of the chain-like particles is 55% or more and 95% or less based on the inorganic particles, wherein the porous layer has a film thickness of 1,000 nm or more and 5,000 nm or less, and wherein the particles other than the chain-like particles have an average particle diameter of 10 nm or more and 300 nm or less, and wherein a difference between a refractive index of a region of the porous layer extending from a position of half of a film thickness of the porous layer to a side of the porous layer adjacent to the substrate and a refractive index of a region of the porous layer extending from the position of half of the film thickness of the porous layer to a side of the porous layer remote from the substrate is 0.01 or less.

2. The article according to claim 1, wherein the particles other than the chain-like particles are at least one member selected from the group consisting of hollow particles, cocoon-shaped particles, and solid particles.

3. The article according to claim 2, wherein the particles other than the chain-like particles are the hollow particles.

4. The article according to claim 1, wherein the inorganic particles include particles of at least one member selected from the group consisting of silicon oxide, magnesium fluoride, lithium fluoride, calcium fluoride, and barium fluoride.

5. The article according to claim 1, wherein the inorganic particles are silicon oxide particles.

6. The article according to claim 5, wherein the inorganic binder is a silicon oxide compound.

7. The article according to claim 1, wherein the porous layer has a refractive index of 1.15 or more and 1.30 or less.

8. The article according to claim 1, further comprising:

an intermediate layer disposed between the substrate and the porous layer.

9. The article according to claim 8, wherein the intermediate layer is a laminate of multiple inorganic compound layers or a polymer layer having a surface with a protrusion and a recess.

10. The article according to claim 1, further comprising:

a functional layer disposed over a surface of the porous layer opposite to a surface adjacent to the substrate.

11. The article according to claim 10, wherein the functional layer contains a polymer having a zwitterionic hydrophilic group.

12. The article according to claim 10, wherein the functional layer is a layer containing a fluoropolymer, a fluorosilane monolayer, or a layer containing a titanium oxide particle.

13. The article according to claim 1, wherein the substrate includes a photoelectric converter and a microlens array, and wherein the article further comprises a light-transmitting plate disposed over a surface of the porous layer opposite to a surface adjacent to the substrate.

14. The article according to claim 13, wherein a refractive index of the porous layer is lower than a refractive index of a microlens included in the microlens array.

15. The article according to claim 13, wherein a film thickness of the porous layer is two or more times larger than a height difference between a protrusion and a recess of the microlens array.

16. The article according to claim 13, further comprising:

an antireflection layer disposed between the porous layer and the microlens array.

17. An optical apparatus, comprising:

a housing; and an optical system including multiple lenses in the housing, wherein at least one of the multiple lenses is the article according to claim 1.

18. An image pickup apparatus, comprising:

a housing;

an optical system including multiple lenses in the housing; and an image pickup element configured to receive light passing through the optical system, wherein the image pickup element is the article according to claim 13.

* * * * *